(12) United States Patent
Hsueh et al.

(10) Patent No.: US 6,547,939 B2
(45) Date of Patent: Apr. 15, 2003

(54) ADJUSTABLE SHADOW MASK FOR IMPROVING UNIFORMITY OF FILM DEPOSITION USING MULTIPLE MONITORING POINTS ALONG RADIUS OF SUBSTRATE

(75) Inventors: Paul Hsueh, Concord, CA (US);
Shyang Chang, Hacienda, CA (US);
Hans Schiesser, Fremont, CA (US);
Michael Ma, Union City, CA (US);
Jack Hsu, San Jose, CA (US);
Abraham C. Ma, Fremont, CA (US)

(73) Assignee: Super Light Wave Corp., San Jose, CA (US)

( * ) Notice: Subject to any disclaimer, the term of this patent is extended or adjusted under 35 U.S.C. 154(b) by 259 days.

(21) Appl. No.: 09/681,402

(22) Filed: Mar. 29, 2001

(65) Prior Publication Data

US 2002/0139666 A1 Oct. 3, 2002

(51) Int. Cl.[7] .............................................. C23C 14/34
(52) U.S. Cl. ........................... 204/298.03; 204/298.04; 204/298.11
(58) Field of Search ........................ 204/298.03, 298.04, 204/298.11, 192.11, 298.15, 298.28; 356/369, 630, 73

(56) References Cited

U.S. PATENT DOCUMENTS

| | | | | |
|---|---|---|---|---|
| 3,904,503 A | * | 9/1975 | Hanfmann | 204/192.12 |
| 3,991,707 A | | 11/1976 | Thelen et al. | 118/9 |
| 4,102,768 A | * | 7/1978 | Kearin et al. | 204/192.13 |
| 4,358,472 A | | 11/1982 | Small et al. | 427/10 |
| 4,868,003 A | | 9/1989 | Temple et al. | 427/39 |
| 5,154,810 A | | 10/1992 | Kamerling et al. | 204/192.13 |
| 5,408,322 A | * | 4/1995 | Hsu et al. | 204/192.13 |
| 5,492,605 A | * | 2/1996 | Pinarbasi | 204/192.11 |
| 5,665,214 A | * | 9/1997 | Iturralde | 204/298.03 |
| 5,937,207 A | | 8/1999 | Ito et al. | 396/6 |
| 6,254,934 B1 | * | 7/2001 | Cherbettchian et al. | 427/255.5 |
| 6,419,803 B1 | * | 7/2002 | Baldwin et al. | 356/369 |
| 6,447,653 B1 | * | 9/2002 | Debley et al. | 204/192.13 |

FOREIGN PATENT DOCUMENTS

JP             63307272 A    *  12/1988      ............ C23C/14/46

* cited by examiner

*Primary Examiner*—Patrick Ryan
*Assistant Examiner*—Gregg Cantelms
(74) *Attorney, Agent, or Firm*—Stuart T. Auvinen (57) ABSTRACT

A vacuum chamber deposits thin films on a substrate by sputtering a target. The beam of atoms or ions from the target is partially blocked by a shadow or adjustable uniformity mask, reducing the deposition rate onto the substrate. The adjustable uniformity mask has several adjustable fingers. The fingers extend or retract to enlarge or reduce the size of the mask. Each finger covers a different annular region or radius of the substrate. The deposition rate at different substrate radii is thus adjustable by the fingers. Several optical beams monitor the film transmittance at different substrate radii. A transmittance profile is continually generated during deposition. As deposition proceeds, radii with a thicker film have their fingers extended to reduce their deposition rate, producing a more uniform film thickness across all radii. Motors extend or retract the individual fingers.

25 Claims, 9 Drawing Sheets

PRIOR ART

FIG. 1

PRIOR ART

FIG. 9

ADJUSTABLE SHADOW MASK FOR IMPROVING UNIFORMITY OF FILM DEPOSITION USING MULTIPLE MONITORING POINTS ALONG RADIUS OF SUBSTRATE

BACKGROUND OF INVENTION

This invention relates to thin-film deposition systems, and more particularly to shadow masks to control the film deposition rate and uniformity.

Electrical and optical systems often rely on devices with thin films. For example, an optical filter may have a hundred layers of films stacked together, each being a quarter of a desired wavelength. These thin films must be deposited with a uniform thickness to prevent unwanted effects, such as a spreading of the wavelength filtered.

Figure 1:
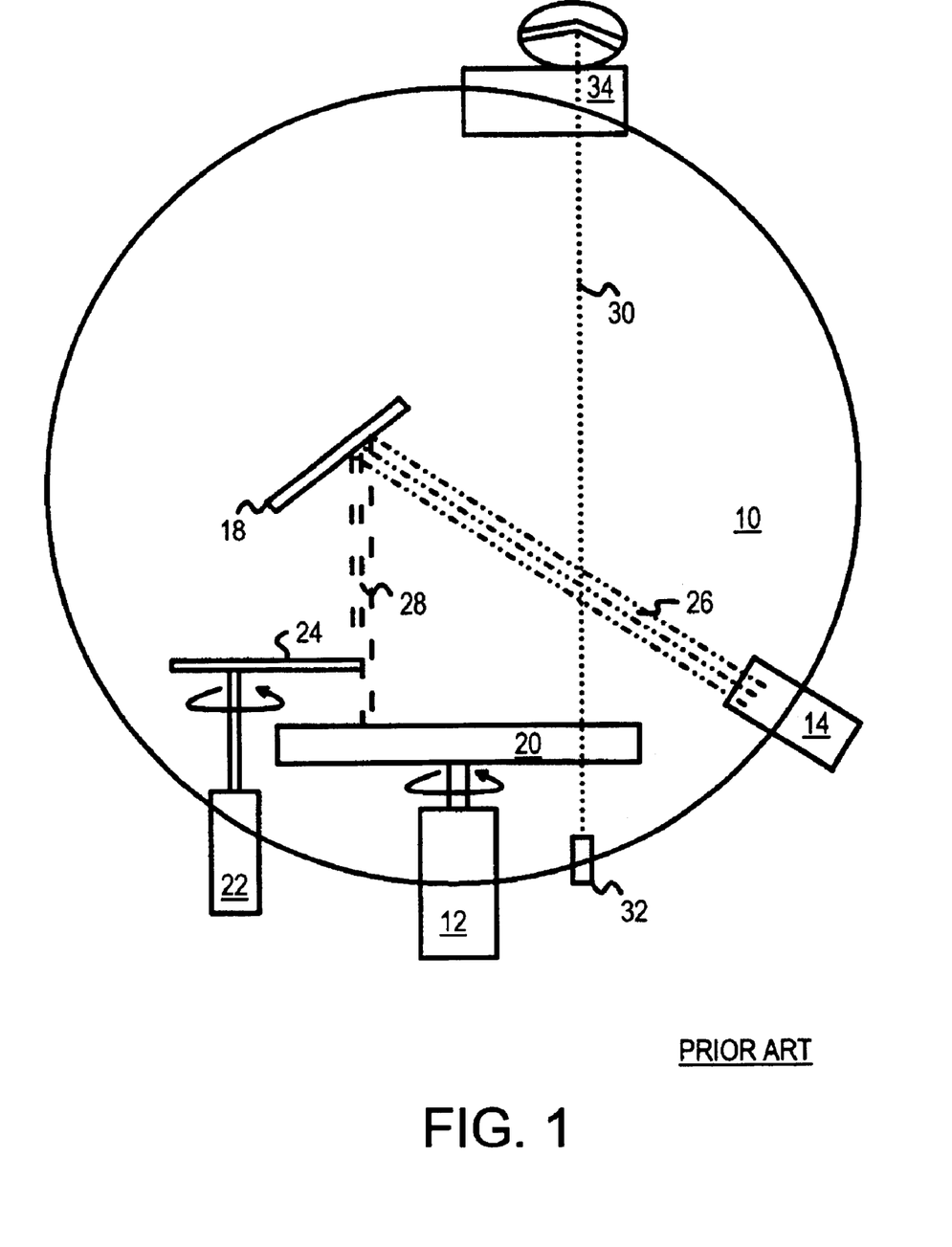
FIG. 1 shows a thin-film deposition chamber using a shadow mask.

These thin films can be deposited in a vacuum chamber using a sputtering or ion beam method. FIG. 1 shows a thin-film deposition chamber using a shadow mask. Chamber 10 is part of a larger film-deposition machine. The air is pumped out of chamber 10 to produce a low-pressure, near-vacuum environment. A substrate 20 is placed in the chamber. One or more layers of thin films are deposited on the upper surface of substrate 20. Substrate 20 is rotated by motor 12 to improve uniformity of deposition.

Ion-beam source 14 generates ion beam 26 that is directed against target 18. Target 18 is made from an ultra-pure target material that supplies the atoms that form the film being deposited onto substrate 20. For example, target 18 can be of a silicon-dioxide SiO2 material or of Tantalum (Ta) material to adjust the index of refraction of the deposited film. Target 18 is a consumable item and must be replaced with a new target after films have been deposited.

When ion beam 26 impacts the surface of target 18, some of the target's atoms are ejected or sputtered off of target 18. These atoms or ions from target 18 then travel from target 18 to substrate 20 as target beam 28. When the atoms from target beam 28 impact the upper surface of substrate 20, they attach to the surface and form a thin film. Over time, the film on substrate 20 becomes thicker and thicker until the desired thickness is reached, and ion-beam source 14 is turned off. Substrate 20 and target 18 can be heated to improve reaction rates.

As target 18 is consumed, and its surface roughness changes, so the rate that atoms or ions are sputtered off its surface can vary. To control the uniformity of film deposited on the substrate, shadow mask 24 can be used to partially block target beam 28. Shadow mask 24 may consist of several blades. Each blade is made especially for each of the different target materials. A technician can do a test run before each production deposition run to check the uniformity of deposition across the substrate and use the test run results to modify the shadow mask shape to achieve better uniformity. Motor 22 rotates shadow mask 24 to select one of the blades, or to move shadow mask 24 out of position so substrate 20 can be loaded or removed.

While the end of deposition of each layer of film can simply occur after a fixed amount of time, an optical monitoring system improves results. Light source 32 shines light beam 30 through substrate 20 and into endpoint detector 34. The thin-film deposited onto the surface of substrate 20 interferes with light beam 30, attenuating the intensity of light beam 30 before it reaches detector 34. This attenuation varies as the film becomes thicker during deposition. Endpoint detector 34 analyzes one or more wavelengths of light beam 30 and signals an endpoint when a predetermined attenuation is reached. Ion-beam source 14 is then turned off for that layer of film deposition. When non-transparent substrates are used, the light beam can be reflected off the surface of the substrate rather than transmitted through the substrate.

Figure 2:
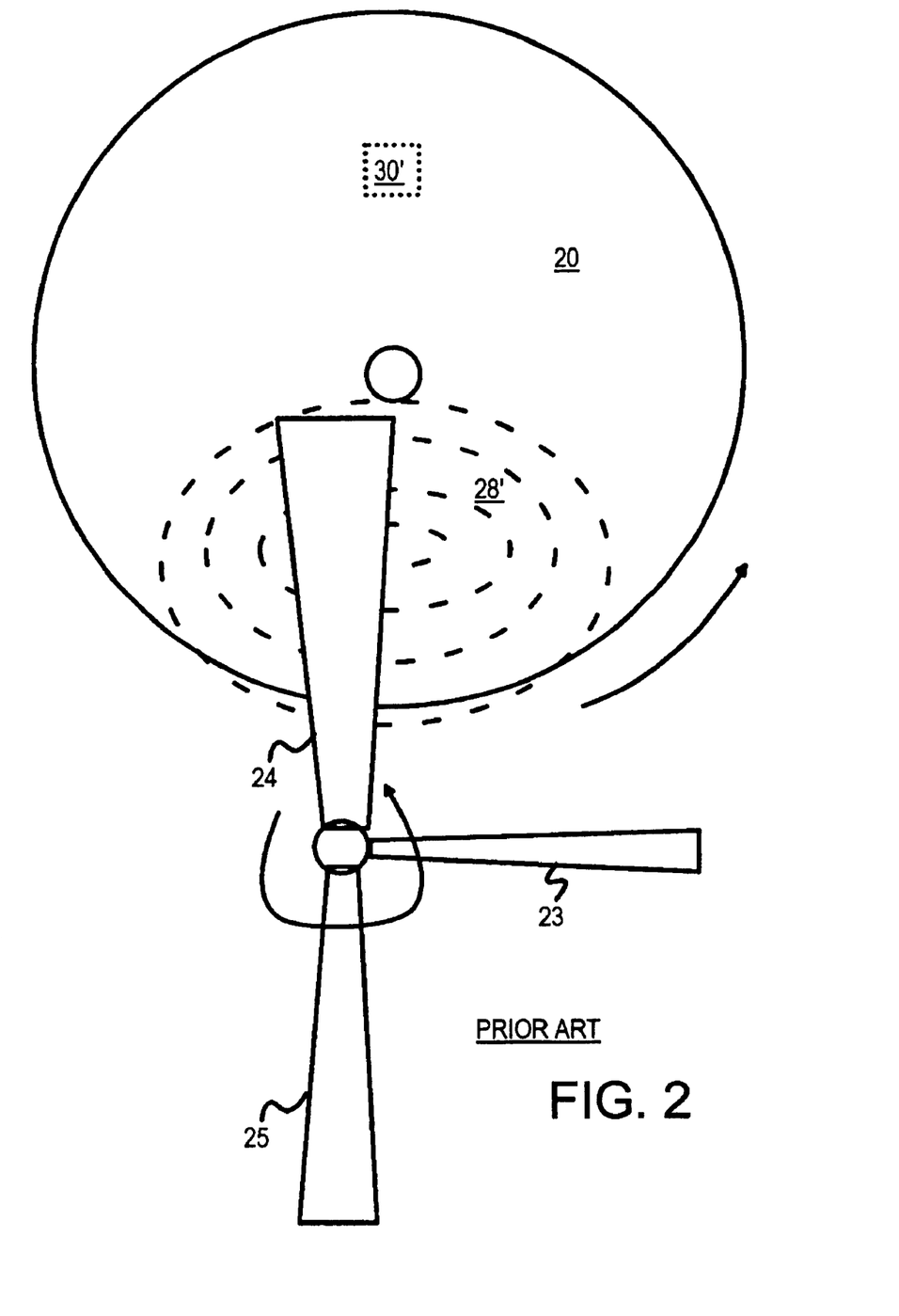
FIG. 2 shows a prior-art shadow mask.

FIG. 2 shows a prior-art shadow mask. Substrate 20 is rotated at a predetermined speed so that the whole substrate 20 can be covered by target beam 28. Target beam 28 falls on target area 28' which is where film deposition occurs. Variations of beam intensity within target area 28' are thought to contribute to film non-uniformity.

Shadow mask 24 is a metal blade that obstructs the target beam where shadow mask 24 overlaps target area 28'. The blade can be shaped so that more obstruction occurs for smaller radii near the center of substrate 20 than for the larger radii near the outer rim of substrate 20. Areas near the center have a slower linear velocity than regions near the outer rim, and thus lower-radius areas spend more time inside target area 28'. To compensate, the shape of the blades reduces the film thickness near the center of substrate 20 relative to film thickness near the outer rim of substrate 20.

Shadow mask 24 can be rotated, allowing other blades 23, 25 to be selected to overlap target area 28'. Wider blades reduce the deposition rate, while thinner blades increase the deposition rate. All blades can also be rotated out of position so substrate 20 can be removed or loaded.

While using a shadow mask can improve film uniformity, the degree of control is limited since one of only three shadow mask blades can be pre-selected. The endpoint is determined by the light beam falling on area 30' of substrate 20, which covers only a limited range of radii. Uniformity at different radii is typically checked by a technician who removes substrate 20 from the vacuum chamber and performs a series of measurements on the film. In-situ monitoring of the film at different radii is not provided, and no feedback control mechanism is used. The shadow mask is selected for use during the entire film deposition period and is not normally changed during a run.

Better uniformity of film thickness is desired. This can be achieved by using a multi-radius monitor that controls and varies the shadow mask within a deposition run.

DETAILED DESCRIPTION

The present invention relates to an improvement in film deposition. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
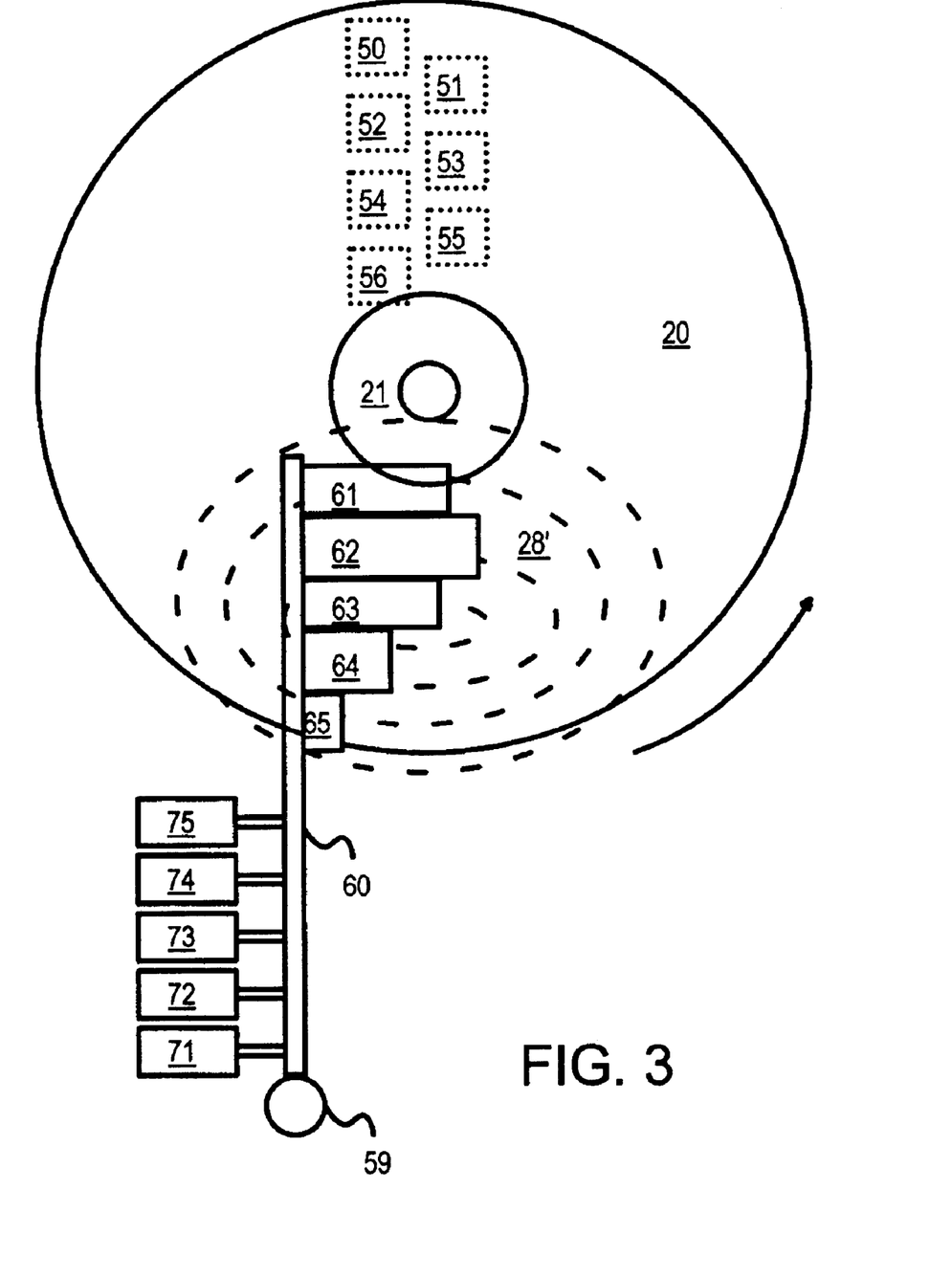
FIG. 3 is a top view of the rotating substrate showing an adjustable multi-fingered uniformity mask.

FIG. 3 is a top view of the rotating substrate showing an adjustable uniformity multi-fingered shadow mask. Substrate 20 is rotated at a constant speed so that the whole surface of substrate 20 can be covered under target area 28' for deposition of a thin film. Opposite target area 28' are monitoring areas 50-56, where light beams that pass through the film to measure the transmittance of the film being deposited. Monitoring areas 50–56 are located at different distances from the center of substrate 20, and thus measure the film transmittance at several different radii or annular regions. A thickness profile as a function of radius is generated by an interferometer or other device that measures the light passing through monitoring areas 50–56.

The thickness profile is used to adjust the deposition rates at different radii of substrate 20 during deposition. Adjustable uniformity mask 60 contains several adjustable fingers 61–65. Fingers 61–65 are metal plates that are parallel to the surface of substrate 20. Fingers 61–65 block part of the sputtering beam in target area 28' from reaching the surface of substrate 20. The amount that fingers 61–65 are extended or retracted determines how much area of target area 28' is blocked by the shadow or adjustable uniformity mask, and thus how much the deposition rate is reduced.

Since each of fingers 61–65 blocks target area 28' at different radii, fingers 61–65 can be used to radially adjust the deposition rate. Finger 61 is the innermost finger, and adjusts the depositing rate for the innermost radial zone or band of substrate 20. Finger 65 is the outermost finger, and controls the deposition rate for regions near the rim of substrate 20. Fingers 62, 63, 64 are the second, third, and fourth fingers from the center, and thus control deposition rates for the second, third, and fourth annular regions of substrate 20.

In the example shown, finger 62, the second annular region, is most extended, so the deposition rate is most reduced for the second annular region, or radial zones that overlap finger 62. The most retracted finger is outermost finger 65, so the deposition rate is the highest at the outer rim. Since the outer rim travels at a higher linear velocity than inner regions, the deposition rate is normally less as outer substrate regions travel more quickly through target area 28' than do inner regions.

In this example, five fingers 61–65 allow deposition rates to be independently adjusted for five annular regions. Monitoring areas 50–56 allow transmittance measurements to be made for these annular regions. A controller (not shown) can be programmed to measure the transmittance at each annular region, and then adjust the deposition rates for each region to achieve a more uniform thickness profile. The measurements and adjustments can be done continuously during deposition.

Adjustable uniformity mask 60 has motors 71–75 that are linked to fingers 61–65 to control extension and retraction of fingers 61–65. For example, motor 71 moves finger 61, causing it to extend to cover more of target area 28', or retract to cover less of target area 28'. Likewise, motor 72 controls finger 62, while motors 73, 74, 75 control fingers 63, 64, 65 respectively. Adjustable uniformity mask 60 can be swung to the left (counterclockwise) around shaft 59 so that substrate 20 can be loaded or removed. Shaft 59 could also be located between motors 71–75 and fingers 61–65 in the middle of adjustable uniformity mask 60.

Cover 21 may be placed over the center region of substrate 20. Cover 21 may be attached to a central shaft that rotates substrate 20, or may be attached to mask 60. Cover 21 allows for complete blocking of the target beam over the center of substrate 20. Deposition in the center is undesirable since film stress can occur.

Figure 4:
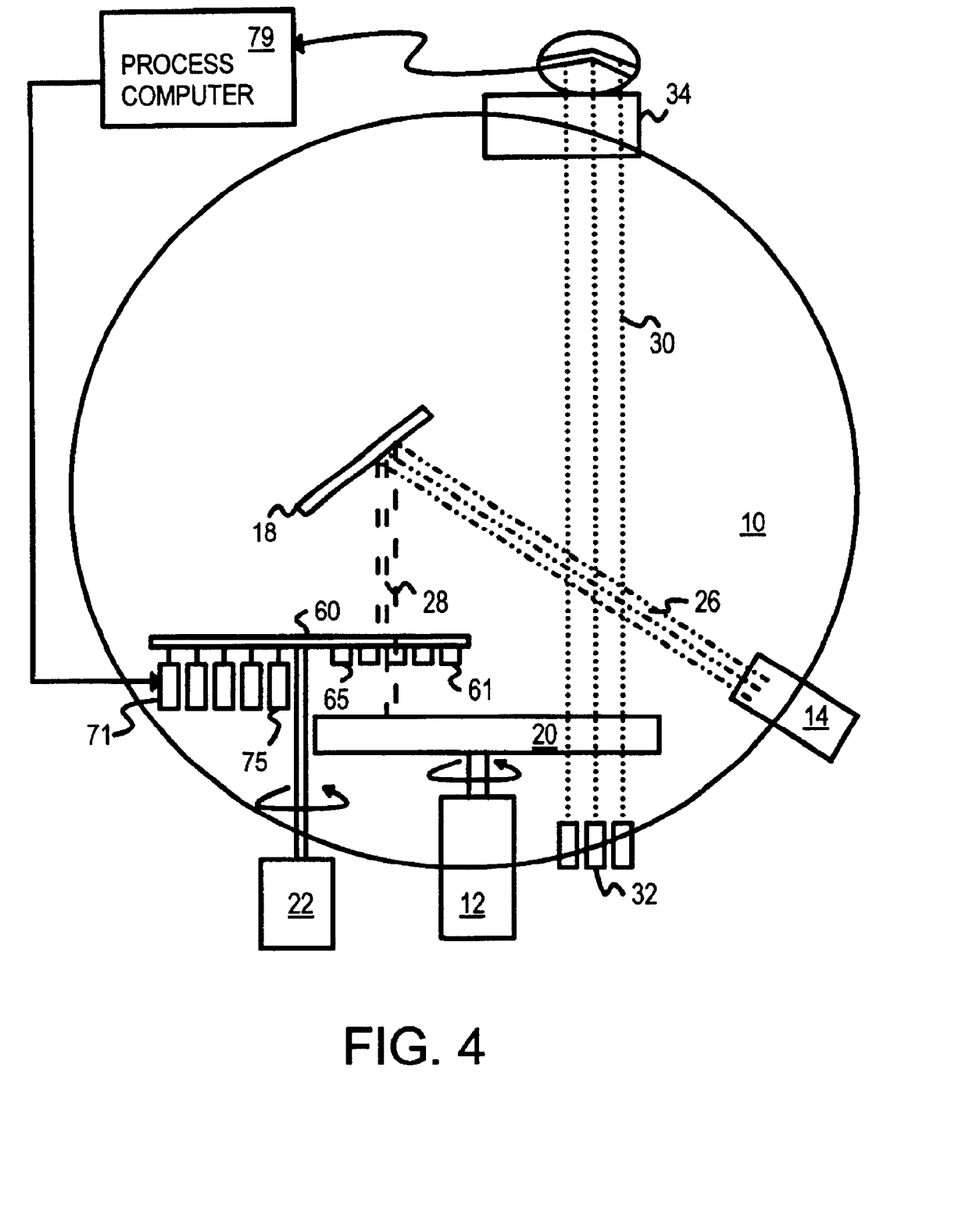
FIG. 4 is a diagram of a deposition chamber with an adjustable uniformity mask and multi-radial monitoring.

FIG. 4 is a diagram of a deposition chamber with an adjustable uniformity mask and multi-radial monitoring. Vacuum chamber 10 contains a near-vacuum, allowing ion beam 26 from ion-beam generator to reach target 18. Some of the atoms from target 18 are sputtered off to form target beam 28, which deposits target atoms onto the top surface of substrate 20. Substrate 20 is rotated by motor 12 at a constant rate to allow all areas to rotate under target area 28'.

Adjustable uniformity mask 60 contains adjustable fingers 61–65 that are parallel to the surface of substrate 20, blocking some of target beam 28 from reaching the top surface of substrate 20. Motors 71–75 control extension and retraction of fingers 61–65 to vary the radial deposition rates. Mask 60 can be swung out of position by motor 22 to allow loading and removal of substrate 20.

Several light beams 30 are generated by light sources 32. These light beams 30 pass through substrate 20 and the film being deposited on it at different radii. Detector 34 measures the film transmittance at several different radii, such as by measuring attenuation or using an interferometer. Several detectors can be used. A separate detector can be used for endpoint detection or the endpoint can be determined by averaging transmittance measurements at several radii.

The transmittance measurements of light beams 30 form a radial transmittance profile. Controller or process computer 79 can input the radial transmittance profile from measurements by detector 34 and determine which annular regions have above-average thickness. Computer 79 then signals motors 71–74 to extend fingers 61–65 for these regions to reduce the deposition rate for these regions. Annular regions with below-average thickness can have their fingers retracted to increase their deposition rate. The amount of extension or retraction of each finger can be determined based on the amount the annular thickness is over or under the average thickness of all annular regions. Many optimizations and predictive algorithms can be devised to improve uniformity.

Figure 5A:
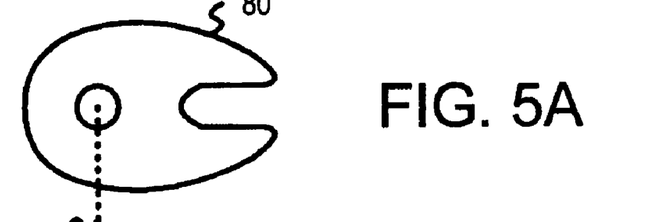
FIGS. 5A–C detail cams with multiple concentric tubes that link the motors to the fingers of the adjustable uniformity mask.
Figure 5B:
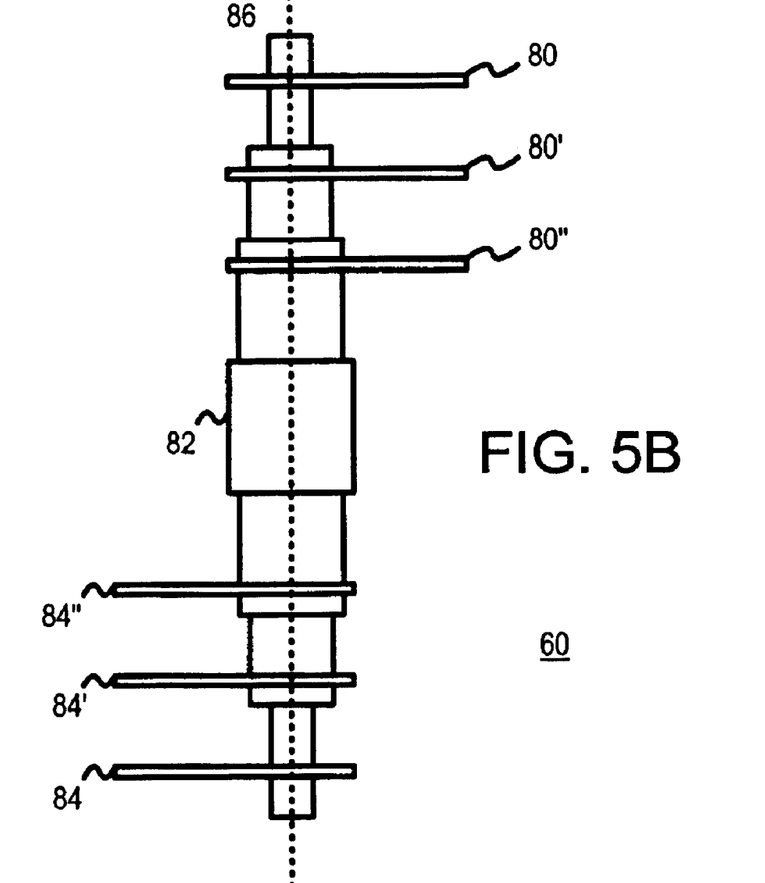
Figure 5C:
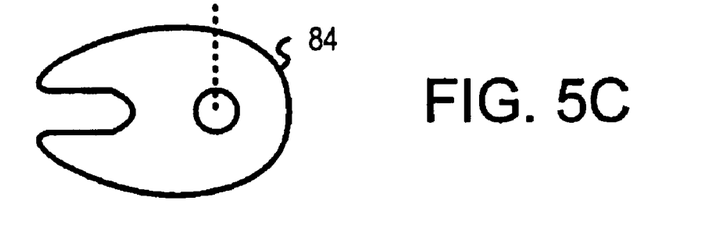

FIGS. 5A–C detail cams with multiple concentric tubes that link the motors to the fingers of the adjustable uniformity mask. In FIG. 5A, finger cam 80 transfers rotational motion of a tube to one of the adjustable fingers. A pin (not shown) fits into the slot on the outer rim of cam 80. A different cam 80 is used for each of the adjustable fingers. FIG. 5C shows motor cam 84, which also has a pin that fits in the slot, to connect to a motor that moves the finger through motor cam 84, concentric tubes 82, and finger cam 80.

FIG, 5B shows in detail the concentric tubes that connect the motors to the fingers. Concentric tubes 82 form the link between motors 71–75 and fingers 61–65 (not shown) of adjustable uniformity mask 60. Concentric tubes 82 include several tubes with different diameters that fit inside one another. The tubes share a common center line 86.

The tube with the smallest diameter is in the middle of the other tubes and is the longest tube, having finger cam 80 mounted on one end, and motor cam 84 mounted on the other end. When the motor rotates motor cam 84, the inner tube is also rotated, causing finger cam 80 to rotate by the same amount.

The second smallest tube is shorter than the longest tube that attaches to cams 80, 84. This second smallest tube connects to motor cam 84', rotating finger cam 80'. The larger-diameter tube connects motor cam 84" to finger cam 80". Additional tubes can be added so that the number of concentric tubes is at least the number of separately-adjustable fingers.

Figure 6A:
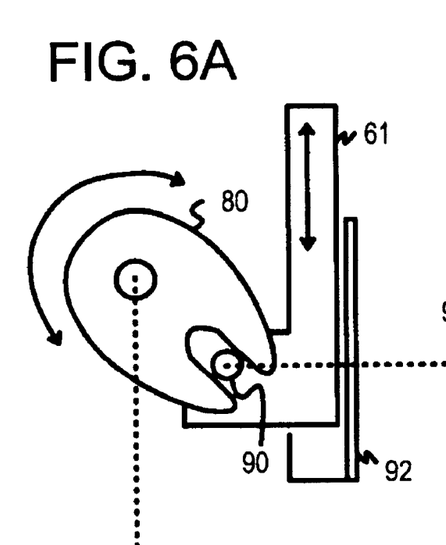
FIGS. 6A–C detail connection of the concentric tubes to the adjustable fingers of the adjustable uniformity mask.
Figure 6B:
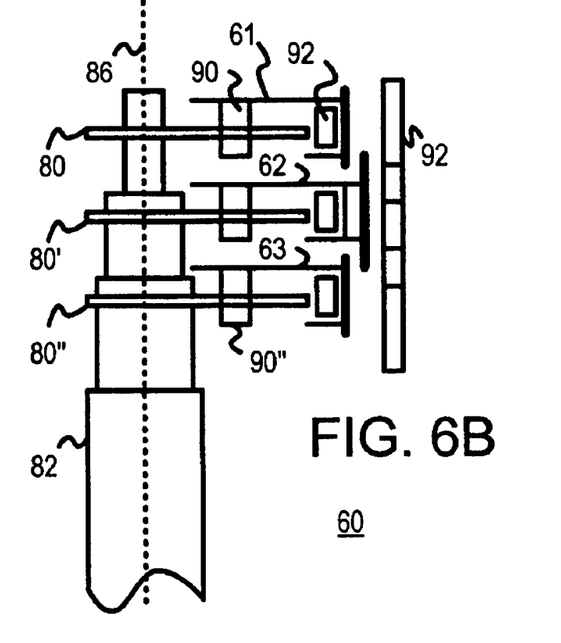
Figure 6C:
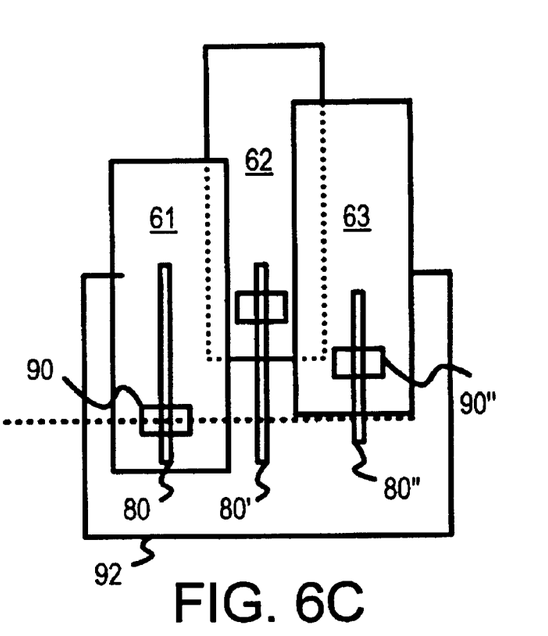

FIGS. 6A–C detail connection of the concentric tubes to the adjustable fingers of the shadow mask. In FIG. 6A, finger cam 80 is one of several finger cams, one for each adjustable finger 61–65 in mask 60. Only 3 of the fingers are shown for simplicity. Finger cam 80 is rotated to extend or retract adjustable finger 61. Pin 90 fits in the slot of finger cam 80, transferring the rotational movement of finger cam 80 to a linear movement of finger 61. Adjustable finger 61 moves along guides 92. Guides 92 are fixed in position while finger 61 moves to extend and retract.

FIG. 6B shows concentric tubes 82 connecting to finger cams 80, 80', 80". Pin 90 fits in the slot of finger cam 80, connecting to finger 61, while pin 90" fits in the slot of finger cam 80", connecting to finger 63. Guides 92 are fixed and guide movement of fingers 61, 62, 63. Fingers 61, 62, 63 move perpendicular to the plane of the drawing in FIG. 6B, but up and down in FIG. 6A and 6C.

In FIG. 6C, adjustable fingers 61, 62, 63 are shown with different amounts of extension. Finger cam 80 has retracted finger 61, which is connected by pin 90. Finger cam 80" has partially extended finger 63, while finger cam 80' has more fully extended finger 62, significantly reducing the deposition rate. Guides 92 direct movement of fingers 61, 62, 63. Guides 92 can be supported by the largest tube of concentric tubes 82, which does not rotate.

Figure 7A:
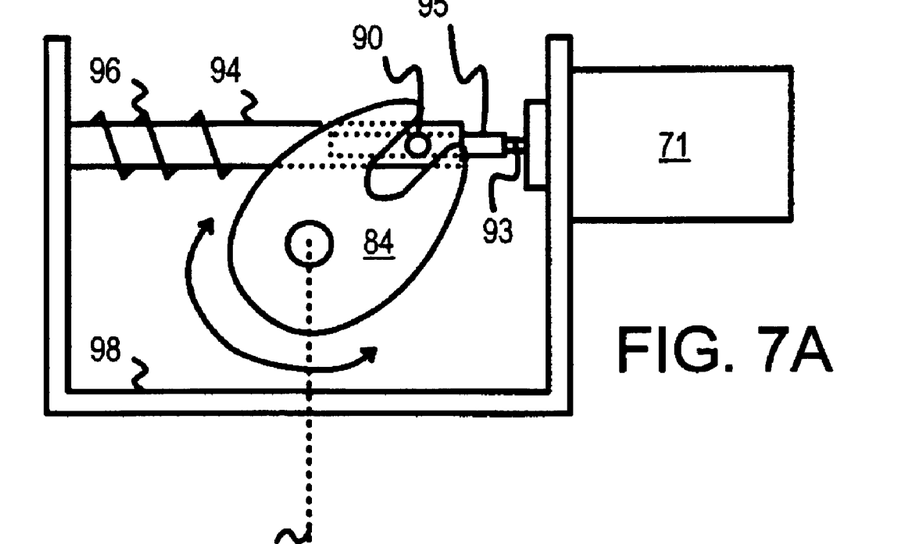
FIGS. 7A–B detail connection of the concentric tubes to the motors that control adjustment of the adjustable uniformity mask.
Figure 7B:
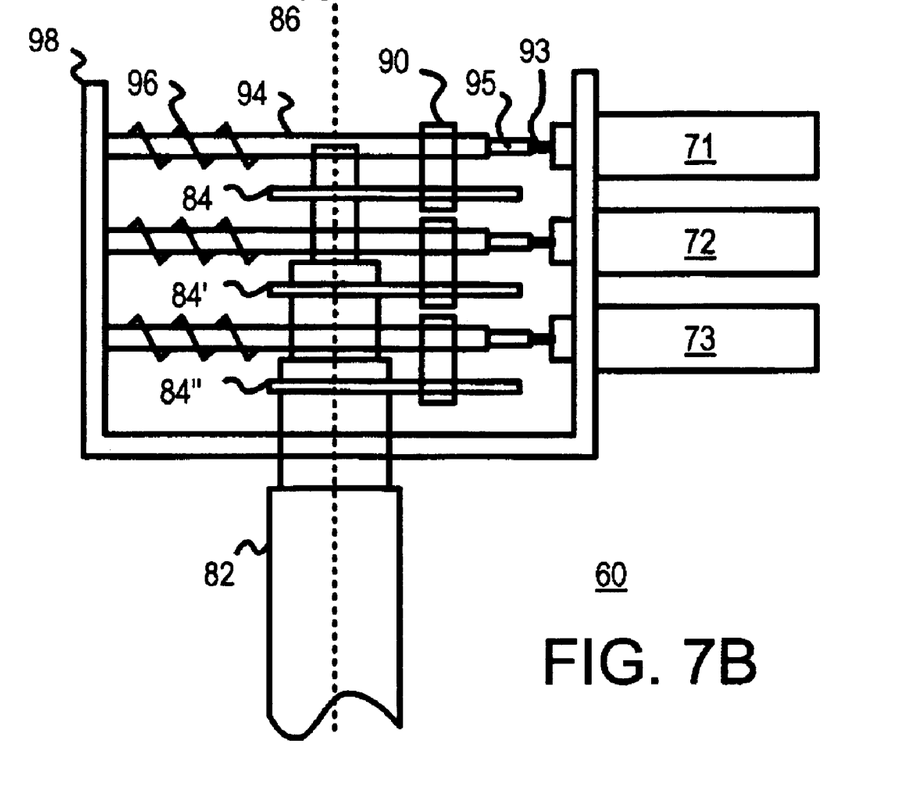

FIGS. 7A–B detail connection of the concentric tubes to the motors that control adjustment of adjustable uniformity mask 60. Motor 71 is a low-gear motor that produces linear movement and has motor shaft 93 that travels left and right. Motor shaft 93 pushes against inner square tube 95 that slides inside square tube 94. Pin 90 goes through inner square tube 95 and is firmly attached to tube 95. Outside square tube 94 has long slots on both sides to allow pin 90 to go through and travel. Compression spring 96 presses against the inner wall of housing 98 and against pin 90 to maintain tension on inner square tube 95 against motor shaft 93. Pin 90 is attached to inner square tube 95 that is moved to the left and right by motor 71. As pin 90 is pushed to the right or left, motor cam 84 is rotated.

In FIG. 7B, the rotation of motor cam 84 is transferred to the smallest-diameter tube of concentric tubes 82, which rotate along center line 86. Motor 71 pushes inner square tube 95 inside square tube 94 to the left or right, which connects to pin 90, which rotates motor cam 84. Likewise, motor 72 causes motor cam 84' to rotate, while motor 73 causes motor cam 84" to rotate. Housing 98 supports motors 71, 72, 73 in proper alignment with motor cams 84. 84', 84".

Figure 8:
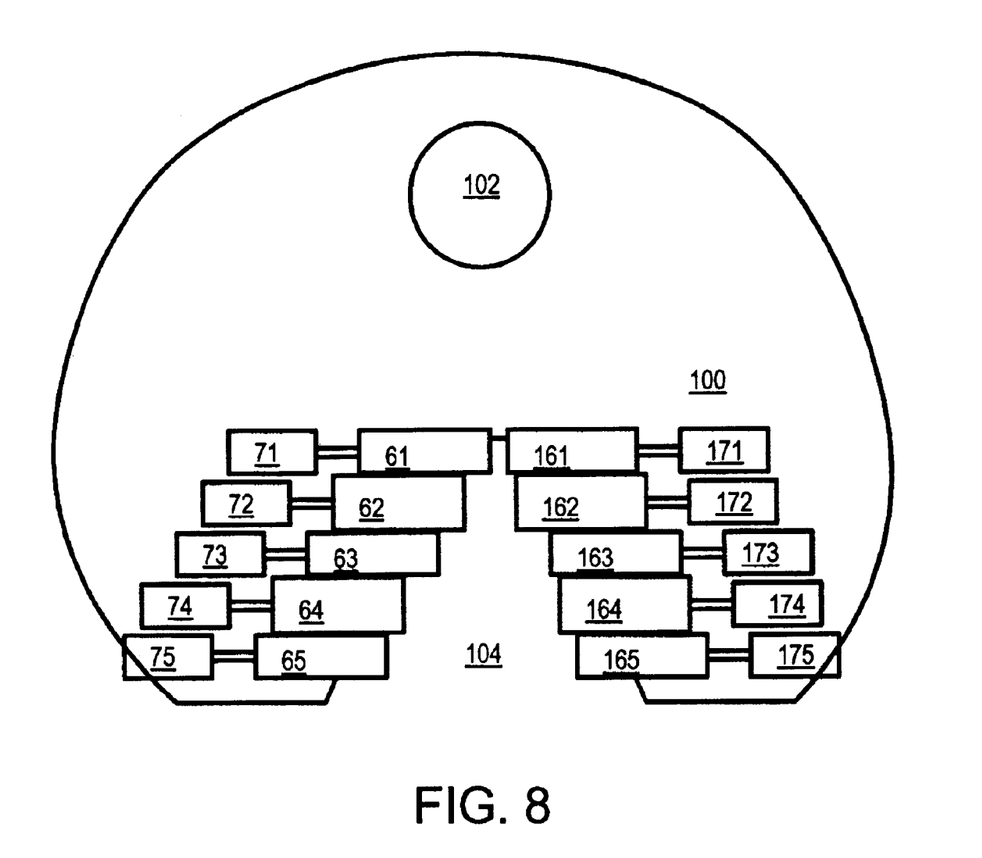
FIG. 8 is an alternate embodiment for the variable adjustable uniformity mask.

FIG. 8 is an alternate embodiment for the variable shadow mask. Disk 100 is a disk that is mounted above the substrate and parallel to it. Disk 100 has opening 102 that allows the light beams to pass through disk 100 for optical monitoring of the substrate's film transmittance. Target opening 104 modulates the target beam that impinges upon the target area of the substrate. Target opening 104 is varied by moving fingers 61–65 on the left side of target opening 104, and by moving fingers 161–165 on the right side of target opening 104. The adjustable fingers vary the width of target opening 104 at different radii of the substrate, and thus control the radial deposition rate. Fingers 61–65 and fingers 161–165 can have enough travel range that they can contact each other and close the opening when they are fully extended.

Concentric tubes and motors can be attached to fingers 61–65 and 161–165 as described earlier. Various modifications are also contemplated. For example, the motors could be mounted on disk 100. Rather than use motors, solenoids 171–175, 181–185 or other movement-generating devices can be used. Solenoids 171–175 can be coupled to fingers 161–165 and motors 181–185 coupled to fingers 61–65 by a bar or sliding shaft without the need for cams. Linear rather than rotary motion is produced by the solenoids or motors in this variation. Disk 100 can be moved out of position over the substrate by a pivot shaft. The fingers can be mounted on only one side of target opening 104, or on both sides.

Figure 9:
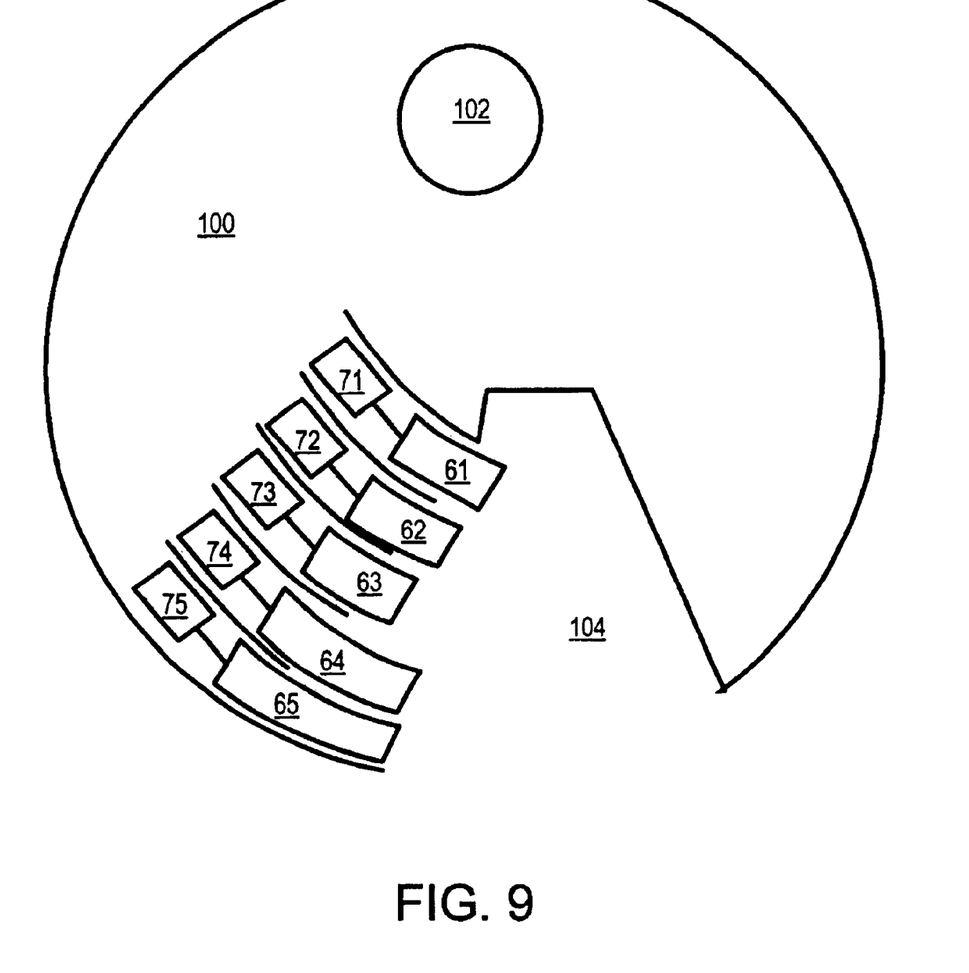
FIG. 9 is an alternate embodiment for the variable shadow mask using curved fingers.

FIG. 9 is an alternate embodiment for the variable shadow mask using curved fingers. Rather than using rectangular fingers, the adjustable-uniformity mask can use curved fingers 161–165 that are moved by motors or solenoids 171–175 along curved tracks in disk 100. Such curved fingers can be mounted on both sides of opening 104, or on just one side.

ALTERNATE EMBODIMENTS

Several other embodiments are contemplated by the inventors. For example the motors can be replaced with actuators, solenoids, electromagnets, or other electro-mechanical devices. A single motor could have several gears, linkages, or a clutch mechanism so that it adjusts all fingers, one at a time. A locking mechanism could keep each finger in position once the motor adjusts that finger. Many more adjustable fingers can be used, such as 12 fingers or 20 fingers. The number of fingers can match the number of optical monitoring points, or can be greater of lesser than the number radii monitored. The fingers can be located very close to other fingers or even overlap adjacent fingers to prevent gaps between fingers. One finger can be located higher than adjacent fingers to allow for horizontal overlap yet still have vertical gaps between fingers. The fingers can have a U-shape or other cross-sectional shape rather than be flat plates. The U-shape can face either into or away from the target.

Multiple targets can be used, and multiple ion beams can be directed at one or more targets. For example, alternating films can be deposited, with even layers having a high index of refraction and odd layers having a low index of refraction by alternately using two targets. A low-pressure gas can also be introduced into the vacuum chamber to react with the target atoms to form the film on the substrate. When non-transparent substrates are used, the light beam can be reflected off the surface of the substrate rather than transmitted through the substrate. The light source may be scanned among different radial positions, rather than using separate light beams for different radii.

The fingers of the shadow mask can be constructed from sheet metal, or other materials such as glass or composites. The material should be able to at least partially block the target beam. Holes could be drilled in the fingers so that they only partially block the target beam. The concentric tubes of the shadow mask could be connected to flexible shafts that extend through the wall of the vacuum chamber, allowing the motors that extend the fingers to be located outside the vacuum chamber. Other gears or coupling devices can be used to couple the motors to the fingers and to allow the fingers to be moved away from the substrate to allow substrate loading and removal. Cams may or may not be used. Some substrate loaders may not require that the shadow mask be moved. The fingers and shadow-mask assembly can be supported in a wide variety of ways. More than one set of fingers can be used and the target beam can be adjustably blocked from two or more sides or from the center of the target-beam area. A single optical beam could be continuously scanned across all radii of the substrate, rather than have separate beams and separate monitoring points. The optical beam could be one or more wavelengths of radiation, and does not have to be visible light, but could include infrared, ultraviolet, X-ray, or other radiation beams.

While the invention has a beneficial application to improving uniformity of film deposition, it may also be applied to intentionally producing non-uniform films. For example, it may be desirable to produce a substrate with a thick film region and a thin film region. The substrate may be sawed or scribed to separate the different film-thickness regions so that separate products with different file thicknesses may be made from one substrate. The controlling computer can be programmed to adjust the fingers for the different desired thicknesses at different radii.

A round cover several inches in diameter can be mounted to the center of the substrate to block target beam deposition in the center area. The target beam is normally more concentrated in the center area due to the low surface speed. This normally produces heavy deposition near the center. This heavy deposition can produce a thick film near the center that is susceptible to film and substrate cracking.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word 'means' is recited in a claim element, Applicant intends for the claim element to fall under 35 USC §112, paragraph 6. Often a label of one or more words precedes the word 'means'. The word or words preceding the word 'means' is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An adjustable uniformity-mask deposition system comprising:
    a chamber for depositing a film on a substrate;
    a target containing material to be deposited as the film on the substrate;
    a target beam for transporting material from the target to the substrate for deposition of the film on the substrate;
    a shadow mask located to intercept a portion of the target beam, reducing a rate of depositing the film on the substrate;
    a monitor measuring a transmittance of the film at different radial locations on the substrate;
    adjustable fingers, on the shadow mask, for intercepting different radial portions of the target beam having different radii of the substrate, each of the adjustable fingers being extendable to reduce a deposition rate at a radius of the substrate of each of the adjustable fingers and retractable to increase the deposition rate at the radius of the substrate of each of the adjustable fingers; and
    a plurality of motors for extending or retracting the adjustable fingers,
whereby film deposition rates at different radii of the substrate are adjustable by the adjustable fingers of the shadow mask.

2. The adjustable uniformity-mask deposition system of claim 1 further comprising:
    a computer, receiving measurements of film transmittance from the monitor, for calculating adjustments to the adjustable fingers;
    wherein the adjustments extend at least one of the adjustable fingers at a radial region with a higher-than-average film thickness indicated by the monitor to reduce the deposition rate at the radius for the higher-than-average film thickness.

3. The adjustable uniformity-mask deposition system of claim 2 further comprising: a motor, coupled to the substrate by a rotating shaft, for rotating the substrate during deposition.

4. The adjustable uniformity-mask deposition system of claim 3 wherein the shadow mask comprises at least three adjustable fingers, each adjustable finger being independently adjustable.

5. The adjustable uniformity-mask deposition system of claim 4 wherein the plurality of motors are activated by signals from the computer to extend or retract the adjustable fingers.

6. The adjustable uniformity mask deposition system of claim 5 wherein the adjustable fingers overlap each other with spaces in between.

7. The adjustable uniformity mask deposition system of claim 5 wherein the adjustable fingers have a U-shape cross-section.

8. The adjustable uniformity mask deposition system of claim 5 wherein the adjustable fingers are on multiple sides of an opening in a disk of the shadow mask.

9. The adjustable uniformity mask deposition system of claim 5 wherein the adjustable fingers are on two sides of an opening in the shadow mask and include a first adjustable finger and a first opposing adjustable finger;
    wherein the first adjustable finger has a range of travel sufficient to meet the first opposing adjustable finger to close the opening for a radius of the substrate of the first adjustable finger.

10. The adjustable uniformity-mask deposition system of claim 5 wherein the plurality of motors move the adjustable fingers by an amount signaled by the computer, the adjustable fingers being adjustable over a range of extensions and retractions.

11. The adjustable uniformity-mask deposition system of claim 5 wherein the shadow mask further comprises:
a shaft having a plurality of concentric tubes for transferring movement by a motor to one of the adjustable fingers.

12. The adjustable uniformity-mask deposition system of claim 11 wherein the shadow mask further comprises:
a motor cam on a first end of each concentric tube, each motor cam coupled to a motor, each motor rotating the concentric tube by moving each motor cam; and
a finger cam on a second end of each concentric tube, each finger cam linked to an adjustable finger,
whereby movement of the motor cam by the motor rotates the concentric tube and the finger cam, extending or retracting the adjustable finger linked to the motor by the motor cam, concentric tube, and finger cam.

13. The adjustable uniformity-mask deposition system of claim 3 wherein measurements and adjustments are repeatedly made before an endpoint is reached and deposition of the film is ended,
whereby in-situ measurements and deposition-rate adjustments are made to deposit the film with a more uniform thickness at different radii.

14. The adjustable uniformity-mask deposition system of claim 13 further comprising:
an ion-beam generator for generating an ion beam aimed at the target to sputter material from the target into the target beam.

15. The adjustable uniformity-mask deposition system of claim 14 wherein the monitor is an optical monitor that comprises:
a plurality of light sources generating a plurality of light beams that fall upon the film at different radial locations;
a plurality of optical detectors that measure intensity of the plurality of light beams after attenuation by the film on the substrate,
whereby optical monitoring uses several light beams.

16. The adjustable uniformity-mask deposition system of claim 15 wherein the different radial locations measured by the light beams are opposite a beam-receiving region of the substrate that receives the target beam,
whereby measurement areas of the substrate are separated from deposition areas.

17. The adjustable uniformity-mask deposition system of claim 16 wherein a computer program determines when the monitor detects an endpoint when a measured transmittance of the film reaches a desired thickness, the ion-beam generator being disabled when the endpoint is reacted to end deposition of the film.

18. The adjustable uniformity-mask deposition system of claim 13 wherein several layers of films are deposited, the several layers including layers of alternating film properties.

19. A deposition system for adjusting radial deposition rates of a film to produce a radially-uniform film thickness comprising:
an ion beam generator for generating an ion beam;
a target that receives the ion beam and generates a target beam;
a substrate being rotated through the target beam, the substrate being only partially covered by the target beam;
an optical-beam generator for generating optical beams that are altered by a film being deposited on a surface of the substrate;
an optical detector for measuring the optical beams to determine transmittance of the film at several different radial locations on the substrate;
a shadow mask with finger plates that partially block the target beam, the finger plates being adjustable during deposition to decrease or increase deposition rates at several annular regions with different radii of the substrate;
a computer, coupled to the optical detector and coupled to control the finger plates, for adjusting positions of the finger plates during deposition of the film to produce a more radially-uniform thickness of the film on the substrate; and
a motor, activated by the computer, for moving a finger plate relative to other finger plates in the shadow mask,
whereby radial deposition rates are adjusted to produce a more radially-uniform thickness of the film.

20. The deposition system of claim 19 wherein the motor comprises an actuator, a solenoid, an electromagnet, or an electro-mechanical device.

21. The deposition system of claim 20 wherein a first finger plate is one of the finger plates and a first motor of the motors connects to the first finger plate through a rotating shaft coupled to the first motor by a first motor cam and coupled to the first finger plate by a first finger cam,
whereby each motor is used to control one of the finger plates.

22. The deposition system of claim 21 wherein the motors are inside a vacuum chamber that contains the substrate, target, and shadow mask.

23. A film depositor comprising:
substrate rotation means for holding a substrate and for rotating the substrate during deposition of a film on a surface of the substrate;
sputter means for sputtering a target to generate a target beam of material to be deposited on the substrate to form the film;
modulate means, situated to partially block the target beam before reaching the substrate, for modulating film deposition rates of radial bands of the substrate wherein a film deposition rate for at least one of the radial bands is modulated in comparison to film deposition rates for other radial bands;
mask means, in the modulate means, for blocking a portion of the target beam, the mask means comprising a plurality of radial-mask means for partially blocking a portion of the target beam for at least one of the radial bands
measure means for measuring a transmittance of the film in the radial bands of the substrate;
feedback modulation means, coupled to the measure means and to the modulate means, for modulating film deposition rates of the radial bands in response to transmittance measurements of the radial bands of the substrate; and
movement-generating means, coupled to the modulate means and activated by the feedback modulation means, for moving a radial-mask means in the plurality of radial-mask means to adjust blockage of the target beam,
whereby film deposition rates at radial bands of the substrate are modulated in response to transmittance measurements of the film in the radial bands.

24. The film depositor of claim 23 wherein the feedback modulate means includes programmable means to deposit films of varying thickness at different ones of the radial bands, whereby different film thicknesses are deposited at different radial bands of the substrate.

25. The film depositor of claim 23 wherein the measure means comprises a scan means for scanning a light source to different radial positions of the substrate to measure transmittance of the film in the radial bands of the substrate, whereby a single light source is scanned to different radial positions.

* * * * *